US011477923B2

(12) United States Patent
    Brown

(10) Patent No.: US 11,477,923 B2
(45) Date of Patent: Oct. 18, 2022

(54) FIELD CUSTOMIZABLE AIRFLOW SYSTEM FOR A COMMUNICATIONS BOX

(71) Applicant: Manufacturing Resources International, Inc., Alpharetta, GA (US)

(72) Inventor: Mike Brown, Cumming, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 11 days.

(21) Appl. No.: 17/061,903

(22) Filed: Oct. 2, 2020

(65) Prior Publication Data
    US 2022/0110227 A1    Apr. 7, 2022

(51) Int. Cl.
    *H05K 7/20*    (2006.01)
    *G02F 1/1333*  (2006.01)

(52) U.S. Cl.
    CPC ... *H05K 7/20972* (2013.01); *G02F 1/133385* (2013.01); *H05K 7/20145* (2013.01)

(58) Field of Classification Search
    CPC .......... H05K 7/20972; H05K 7/20145; H05K 7/20209; H05K 5/0017; H05K 7/20172; H05K 7/20136; H05K 7/20181; H05K 7/20954; G06F 1/20; G06F 1/16; G06F 1/181; G06F 3/1446; G06F 3/1423; G02F 1/133385
    USPC ......... 361/695, 679.01, 694, 679.21, 679.48, 361/679.46, 690, 692, 679.02; 454/184; 165/104.33, 287, 80.3
    See application file for complete search history.

(56) References Cited

U.S. PATENT DOCUMENTS

| 4,093,355 A | 6/1978 | Kaplit et al. |
| 4,292,370 A | 9/1981 | Pekko |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |

(Continued)

FOREIGN PATENT DOCUMENTS

| AU | 2011248190 B2 | 5/2011 |
| AU | 2014287438 B2 | 1/2018 |

(Continued)

OTHER PUBLICATIONS

Itsenclosures, Product Catalog, 2009, 48 pages.
(Continued)

*Primary Examiner* — Mandeep S Buttar
(74) *Attorney, Agent, or Firm* — Standley Law Group LLP; Jeffrey S. Standley; Adam J. Smith

(57) ABSTRACT

Field customizable airflow systems, and methods related to the same, are provided. A housing for an electronic display subassembly includes an intake and an exhaust for ambient air. A communications box located above the electronic display subassembly includes one or more electronic components, a convection aperture plate with one or more apertures, an intake portion, an exhaust portion, and one or more fans which cause a flow of ambient air to be accepted at the intake portion, circulated through each of the apertures in the convection aperture plate, and exhausted through the exhaust portion when activated.

15 Claims, 14 Drawing Sheets

(56) References Cited

U.S. PATENT DOCUMENTS

| | | |
|---|---|---|
| 4,952,783 A | 8/1990 | Aufderheide et al. |
| 4,952,925 A | 8/1990 | Haastert |
| 4,976,536 A | 12/1990 | Vogeley et al. |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolf et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfeller |
| 7,259,964 B2 | 8/2007 | Yamamura et al. |
| 7,269,023 B2 | 9/2007 | Nagano |
| 7,284,874 B2 | 10/2007 | Jeong et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 3,004,648 A1 | 8/2011 | Dunn |
| 7,995,342 B2 | 8/2011 | Nakamichi et al. |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 3,400,608 A1 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |

(56) References Cited

U.S. PATENT DOCUMENTS

| | | |
|---|---|---|
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,080,316 B2 | 9/2018 | Dunn et al. |
| 10,088,702 B2 | 10/2018 | Dunn et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,602,626 B2 | 3/2020 | Dunn |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,757,844 B2 | 8/2020 | Dunn et al. |
| 10,795,413 B1 | 10/2020 | Dunn |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |

(56) References Cited

U.S. PATENT DOCUMENTS

| | | |
|---|---|---|
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0165496 A1* | 7/2008 | Kang .................. G06F 1/20 361/692 |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1* | 5/2011 | Sato .................. G02F 1/133385 345/87 |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1* | 3/2017 | Bowers .................. G06F 1/20 |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |

(56) References Cited

U.S. PATENT DOCUMENTS

| | | |
|---|---|---|
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088368 A1 | 3/2018 | Notoshi et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0154597 A1 | 5/2020 | Dunn et al. |
| 2020/0163235 A1 | 5/2020 | Dunn |
| 2020/0205303 A1 | 6/2020 | Dunn et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2021/0165472 A1* | 6/2021 | Chin ................ G02F 1/133385 |
| 2021/0304644 A1* | 9/2021 | Webster .................... G09F 9/35 |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| BR | PI0820231-1 | 2/2019 |
| CA | 2705814 C | 2/2018 |
| CA | 2947524 C | 4/2018 |
| CA | 2915261 C | 8/2018 |
| CA | 27982777 C | 6/2019 |
| CA | 2809019 C | 9/2019 |
| CA | 2888494 C | 9/2019 |
| CN | 2702363 Y | 5/2005 |
| CN | 202838830 U | 3/2013 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-55567 A | 2/1996 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006-176112 A | 7/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 1 0-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| RU | 2513043 C2 | 4/2014 |
| WO | WO2005079129 A1 | 8/2005 |
| WO | WO2007116116 A1 | 10/2007 |
| WO | WO 2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |

(56) References Cited

FOREIGN PATENT DOCUMENTS

| | | | |
|---|---|---|---|
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation,Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A-Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. V Manufacturing Resources International, Inc.*, Defendant's Amended Answer and Countercliams to Plaintilf's First Amended Complaint, Filed Apr. 24, 2018, 240 pages.
LINKNYC, Free super fast Wi-Fi. And that's just the beginning, Sep. 2, 2020, 3 pages.
LINKNYC, DoITT, Sep. 2, 2020, 1 page.
Wexelbaum, Josh, Link Advertising Capabilites Intersection, Sep. 2, 2020, 3 pages.
Civiq Smartscapes, Connecting people, places & experience, Sep. 2, 2020, 7 pages.

* cited by examiner though useful, detailed descriptions of both ## BACKGROUND AND SUMMARY OF THE INVENTION

FIELD CUSTOMIZABLE AIRFLOW SYSTEM FOR A COMMUNICATIONS BOX

CROSS-REFERENCE TO RELATED APPLICATIONS

This application makes no priority claim.

TECHNICAL FIELD

Exemplary embodiments relate generally to a field customizable airflow system for a communications box and systems and methods related to the same.

BACKGROUND AND SUMMARY OF THE INVENTION

It has become increasingly desirable to include certain electronic equipment with display assemblies featuring electronic displays. Such electronic equipment may include, for example, communications equipment, sensing equipment, combinations thereof, and the like. For example, advertising or announcements may be displayed at the electronic displays and internet connectivity may be facilitated by the electronic equipment. Such electronic displays and electronic equipment may be provided in ruggedized housings to protect the electronic displays and equipment from harsh environmental conditions. Sometimes, the electronic equipment is provided in a box above the electronic displays. The elevated position of the box may facilitate signal propagation and reception. Other times, the box is provided at other locations within the ruggedized housing, such as behind one or more of the electronic displays or below the electronic displays.

The electronic equipment may be placed in various locations within the box, and the various pieces of equipment may have different airflow needs. For example, some such equipment may require airflow for cooling and/or proper operation. Lack of adequate airflow may result in equipment failure, improper operation, or undesirable consequences. Other such equipment may not require cooling and/or may not be configured to handle moisture, debris, or other material that might be present in the airflow. Furthermore, it may be desirable to change the type, location, or the like of the electronic equipment in the box over time. For example, equipment may be upgraded, equipment may be removed, new equipment may be developed or desired, communications protocols may change (thus requiring new equipment), or the like. Therefore, what is needed is a field customizable airflow system for a communications box.

A field customizable airflow system for a communications box is provided. A display assembly may include one or more electronic display subassemblies and a communications box. The communications box may include one or more electronic components, at least some of which may have different airflow requirements. One or more convection aperture plates may be provided within the communications box. Each of the convection aperture plates may comprise one or more apertures. The apertures may be provided adjacent to planned or actual locations of at least certain ones of the electronic components to force air to pass by at least certain ones of the electronic components. In this way, areas of relatively high airflow and/or cooling and areas of relatively low airflow and/or cooling may be engineered within the communications box. For example, the convection aperture plates may be utilized to create a single airflow pathway, or multiple airflow pathways for air within the communications box as required by the various pieces of electronic equipment. The convection aperture plates may comprise any number, size, shape, location, or configuration of apertures to accommodate airflow needs of the new and/or updated electronic components.

Such convection aperture plates may be provided in new display assemblies, or retrofitted into existing display assemblies. In the event that certain electronic equipment is added, removed, or changed from the communications box, such as due to failure, the need or desire to upgrade, the need or desire to add new equipment, combinations thereof, or the like, the convection aperture plate(s) may be replaced, removed, or added as needed to provide appropriate airflow through the communications box to address the airflow needs of the electronic equipment.

Air in the communications box may comprise ingested ambient air. In exemplary embodiments, the air ingested into the communications box may comprise a portion of ambient air ingested into the display assembly at an intake, where a second portion of the ambient air ingested at the intake may travel into or along the electronic display subassemblies. In other exemplary embodiments, the air in the communications box may comprise circulating gas and thermal devices may be provided with the communications box to remove heat from the circulating gas.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
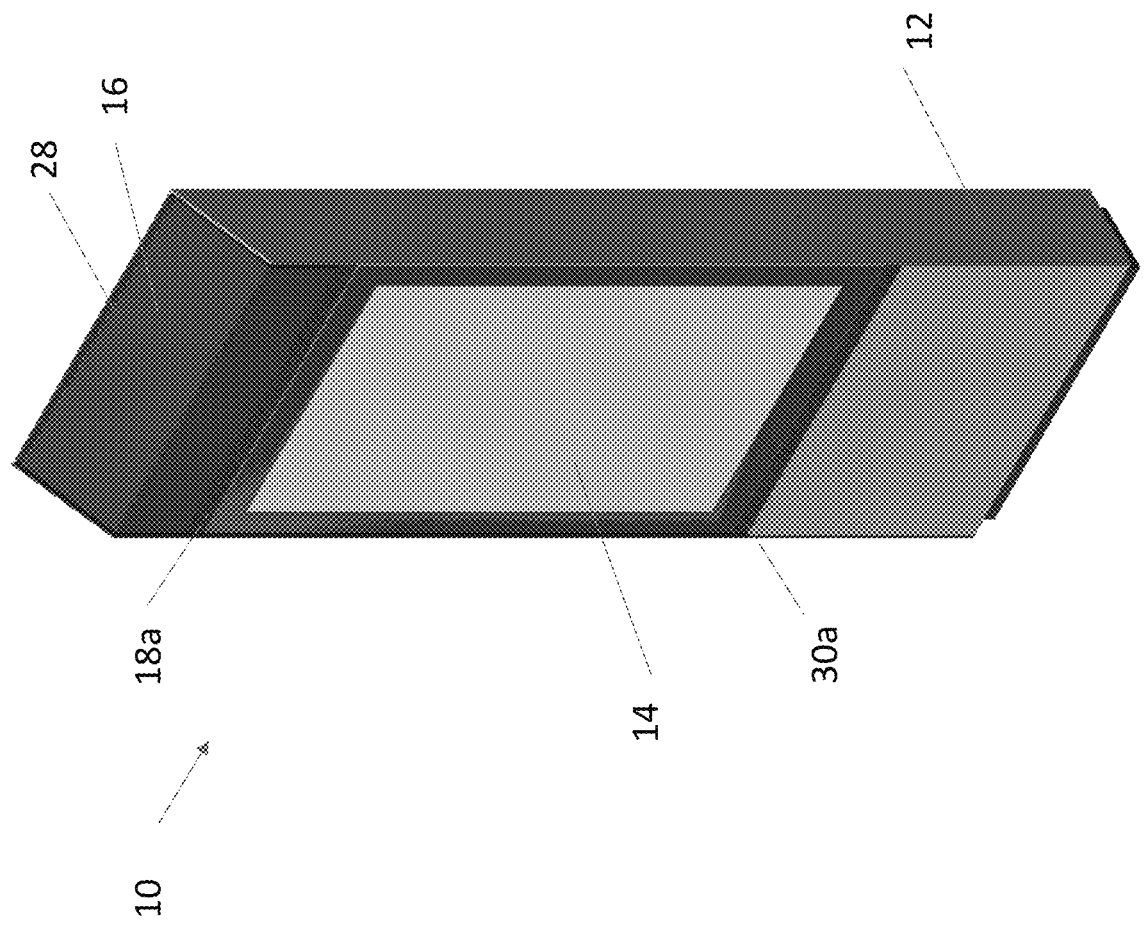
FIG. 1 is a front perspective view of an exemplary display assembly.

FIG. 1 illustrates an exemplary display assembly 10. The assembly 10 may comprise one or more housings 12. The assembly 10 may comprise one or more electronic display subassemblies 14. For example, without limitation, a first and second electronic display subassembly 14 may be positioned in a back-to-back arrangement within the housing 12, though any number and location of such electronic display subassemblies 14 may be utilized. The housing 12 may comprise a frame and/or a full or partial enclosure for each of the electronic display subassemblies 14. The electronic display subassemblies 14 may be moveably mounted to said housing 12.

Each electronic display subassemblies 14 may comprise an electronic display layer, a backlight, one or more airflow pathways, electronic components (e.g., processors, electronic storage devices, timing and control boards, video players, combinations thereof, or the like), one or more optical films, diffusion layers, fans, combinations thereof, or the like. The electronic display subassemblies 14 may comprise of any type of electronic display including, but not limited to, LCD displays, LED displays, plasma displays, OLED displays, or the like. Such electronic displays may be directly backlit, edge lit, combinations thereof, or the like.

A communications box 16 may be provided above the electronic display subassemblies 14, though other locations for the communications box 16 may be utilized. More than one communications box 16 may be utilized. For example, without limitation, the communications box 16 may alternatively or additionally be positioned behind or between one or more of the electronic display subassemblies 14, below the electronic display subassemblies 14, combinations thereof, or the like. In exemplary embodiments, the communications box 16 comprises materials configured to permit the transmission and/or receipt of electronic signals, such as, but not limited to, radio waves, Wi-Fi, near field communication, cellular networks signals, combinations thereof, and the like. At least a portion of the communications box 16 may be formed by the housing 12, though the communications box 16 may comprise a separate housing. The communications box 16 may be located immediately adjacent to the housing 12 or may be elevated above the housing 12, for example without limitation. The communications box 16 may define a cuboid shape, though any shape may be utilized.

One or more intakes 18 may be located at the housing 12. One or more exhausts 30 may be located at the housing 12. In exemplary embodiments, an intake 18 is located above each of the electronic display subassemblies 14 and an exhaust 30 is located below each of the electronic display subassemblies 14, though any location and number of the intakes 18 and exhausts 30 may be utilized. The intakes 18 may be configured to ingest ambient air while the exhausts 30 may be configured to exhaust ambient air. Airflow pathways may be provided within the housing 12 between the intakes 18 and the exhausts 30. Such airflow pathways may extend within, or along, the electronic display subassemblies 14.

The communications box 16 may comprise one or more vents 28 for exhausting ambient air. In exemplary embodiments, the vent 28 is located along an upper surface of the communications box 16, though any number and locations of vents 28 may be utilized. The vent 28 may be configured to exhaust at least a portion of the ambient air ingested at the intakes 18. Airflow pathways may extend from the intakes 18 to the vents 28.

Figure 2:
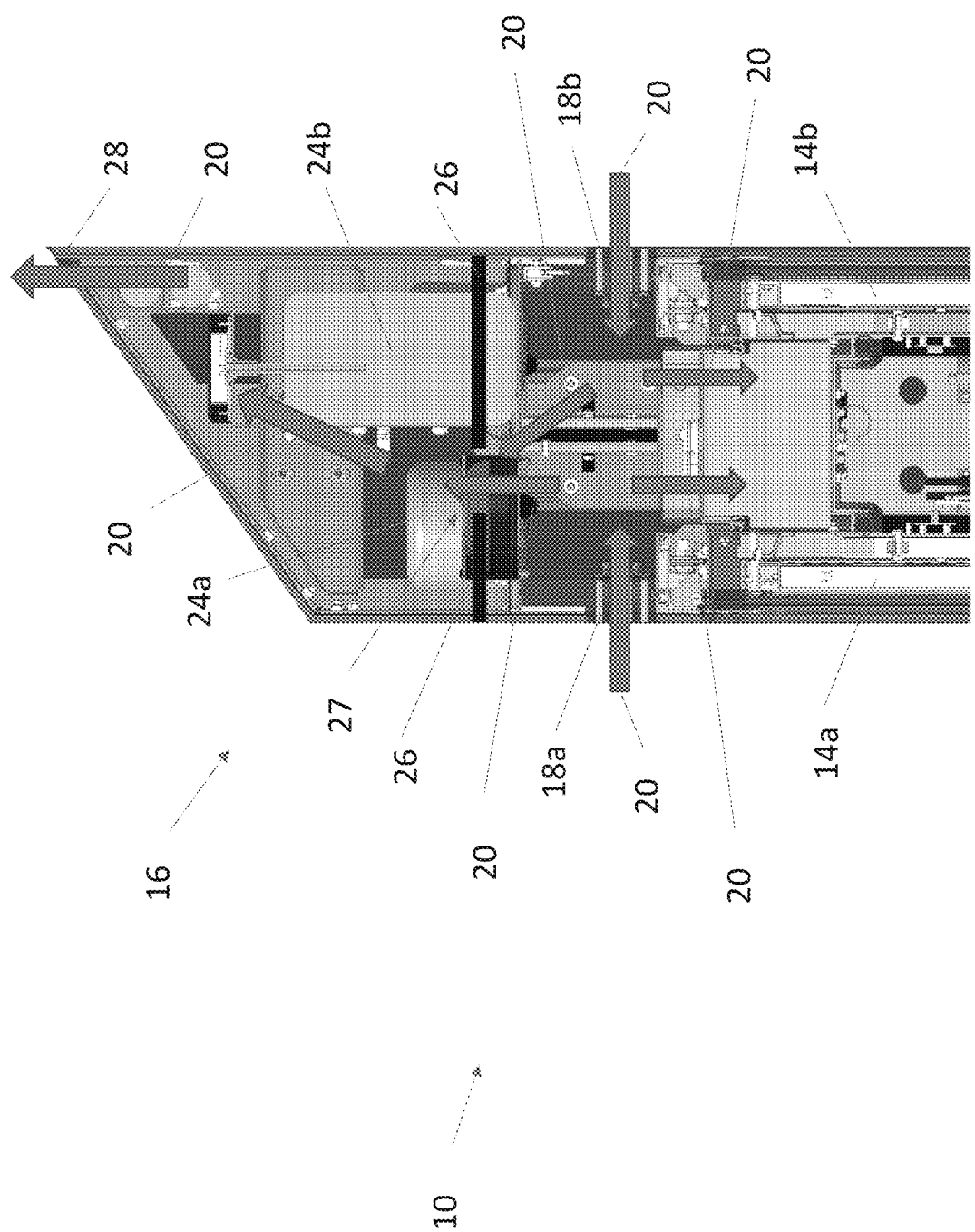
FIG. 2 is a side sectional view of the display assembly of FIG. 1 illustrating exemplary airflow.

FIG. 2 illustrates a detailed sectional view of the communications box 16. One or more electronic components 24 may be located within the communications box 16. Such electronic components 24 may include, but are not limited to, Wi-Fi devices, network communication devices, internet modems, cellular network devices, near field communication devices, antenna, radio transmitters, radio receivers, satellite communications equipment, combinations thereof, or other communications equipment. Such electronic components 24 may alternatively or additionally include, but are not limited to, airflow velocity sensors, airflow rate sensors, moisture sensors, air quality or composition sensors (e.g., for detecting pollutants, toxins, certain chemicals or other substances, combinations thereof, or the like), temperature sensors, humidity sensors, pressure sensors, accelerometers, magnetometers, altimeters, incline sensors, microphones, ambient light sensors, cameras, combinations thereof, or other sensors. Such electronic components 24 may alternatively or additionally include, but are not limited to, computerized devices, electronic storage devices, processors, servers, video players, timing and control boards, speakers, amplifiers, cameras, microphones, location detection devices, GPS devices, air quality sensors, combinations thereof, or other equipment for operating the display assemblies 10 or gathering information. Any number, kind, or type of electronic components 24 may be utilized in any combination. The same or different electronic components 24 may be used across different display assemblies 10. Each of the electronic components 24 may have the same or different airflow needs for proper and/or optimal operation, such as, but not limited to, for detecting characteristics of ambient air, longevity, and/or cooling. For example, without limitation, certain sensors may require relatively low air velocity to properly function, while certain communication devices may require relatively high air velocity to adequately remove heat. As yet another example, certain electronic devices may not be configured to handle moisture, debris, pollutants, and/or temperatures of certain airflow, such as, but not limited to, ambient air, while other components may be so configured.

A convection aperture plate 26 may be provided within the communications box 16. The convection aperture plate 26 may comprise one or more apertures 27 positioned to direct airflow to all or some of the electronic components 24. The apertures 27 may be of the same, or varying size and shape and may be provided in any arrangement of configuration. Any number of apertures 27 may be provided in any size, shape, or the like.

Each of the electronic components 24 may have varying airflow needs. The convection aperture plate 26 may be designed with apertures 27 at select locations to accommodate such airflow needs. Furthermore, it may be desirable to change out various electronic components 24. For example, without limitation, different customers or users may desire different electronic components 24. As another example, without limitation, the electronic components 24 may be changed or upgraded over time to provide improved performance, integrate with other networks, operate under new protocols, or the like. The convection aperture plates 26 provided across various assemblies 10 may be of the same or different design to accommodate different types and/or arrangement of electronic equipment 24. Alternatively, or additionally, the convection aperture plate(s) 26 provided in a particular assembly 10 may be changed out or otherwise altered to reflect changing airflow requirements, such as when new equipment 24 is added, existing equipment 24 is removed, equipment 24 is rearranged, or equipment 24 is upgraded, any combination thereof, or the like.

The convection aperture plate 26 may be configured to have a footprint matching interior dimensions of the communications box 16. The convection aperture plate 26 may be substantially planar and create a barrier within the communications box 16 such that air must travel through the apertures 27 to be exhausted through the vent 28. The convection aperture plate 26 may define a footprint substantially matching a footprint of the communications box 16.

In exemplary embodiments, the convection aperture plate 26 may be configured to provide apertures 27 adjacent to the planned or actual location of certain electronic equipment 24 in the communications box 16, but not other such electronic equipment 24 in the communications box 16. The convection aperture plate 26 may form a barrier within the communications box 16 where said apertures 27 facilitate airflow to particular locations within the communications box 16 while preventing or impeding airflow to other locations within the communications box 16. For example, without limitation, apertures 27 of particular size or shape may be placed adjacent to the actual or planned location of certain ones of the electronic components 24 requiring airflow. The size, shape, and locations of the apertures 27 may be provided to facilitate airflow to the adjacent electronic components 24 to meet such airflow needs. Other electronic components 24 may not require airflow, and/or it may not operate optimally under forced airflow conditions. No such apertures 27 may be provided at the convection aperture plate 26 near actual or planned locations of electronic components 24 not requiring airflow and/or requiring other airflow conditions. For example, without limitation, the convection aperture plate 26 may comprise a solid material or otherwise be fluidly sealed at such locations to prevent or impede airflow to such equipment 24.

Ambient air 20 may be ingested into the assembly 10. In exemplary embodiments, a first flow of ambient air 20 may be ingested at a first intake 18a and a second flow of ambient air 20 may be ingested at a second intake 18b. A first portion of the first flow and a first portion of the second flow of the ingested ambient air 20 may travel into the communications box 16. A second portion of the first flow and a second portion of the second flow of the ambient air 20 may travel along or into the first and second electronic display subassemblies 14a, 14b, respectively. The first portion and the second portion may travel through one or more of the apertures 27 in the convection aperture plate 26. The ambient air 20 may circulate within some or all of the communications box 16. The ambient air 20 may exit the communications box 16 by way of the vent 28.

Figure 3:
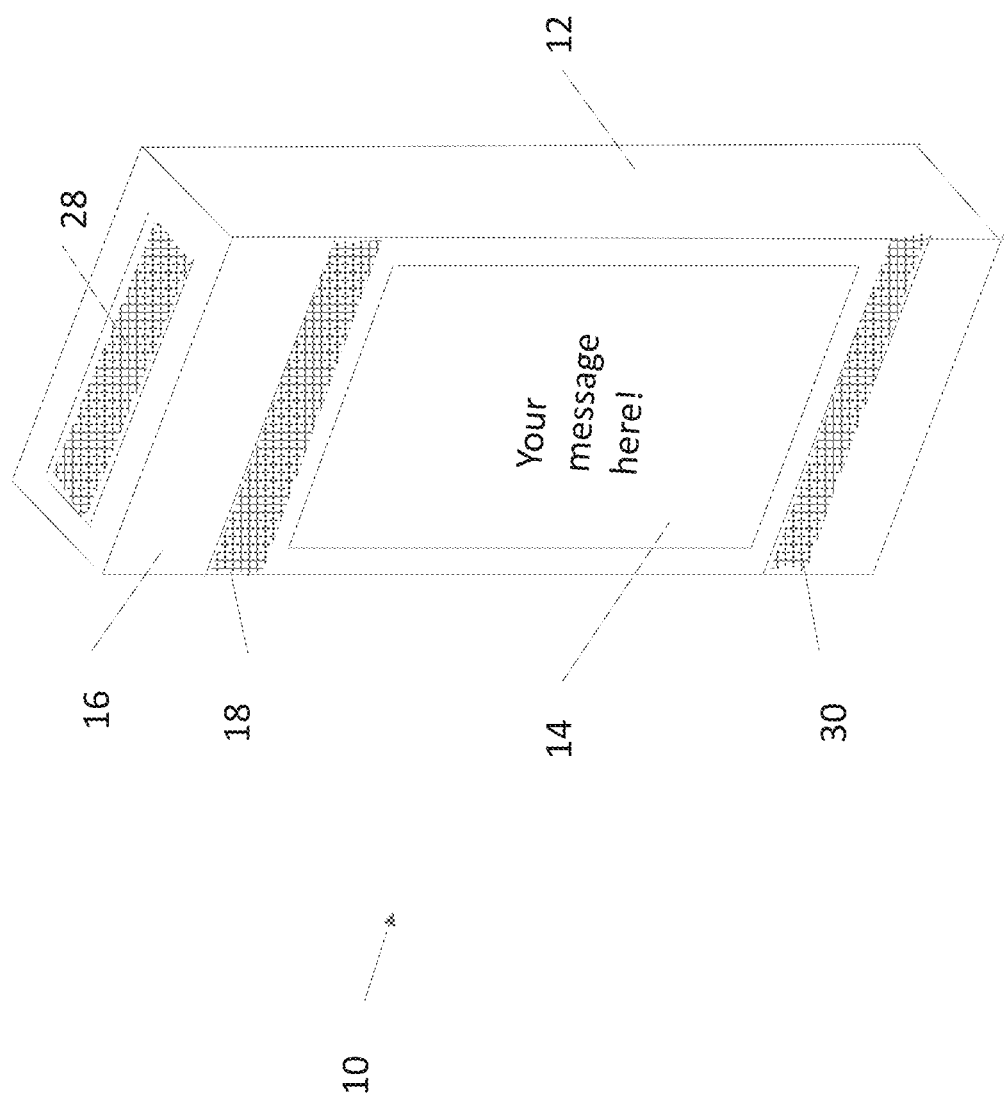
FIG. 3 is a front perspective view of another exemplary display assembly.
Figure 4:
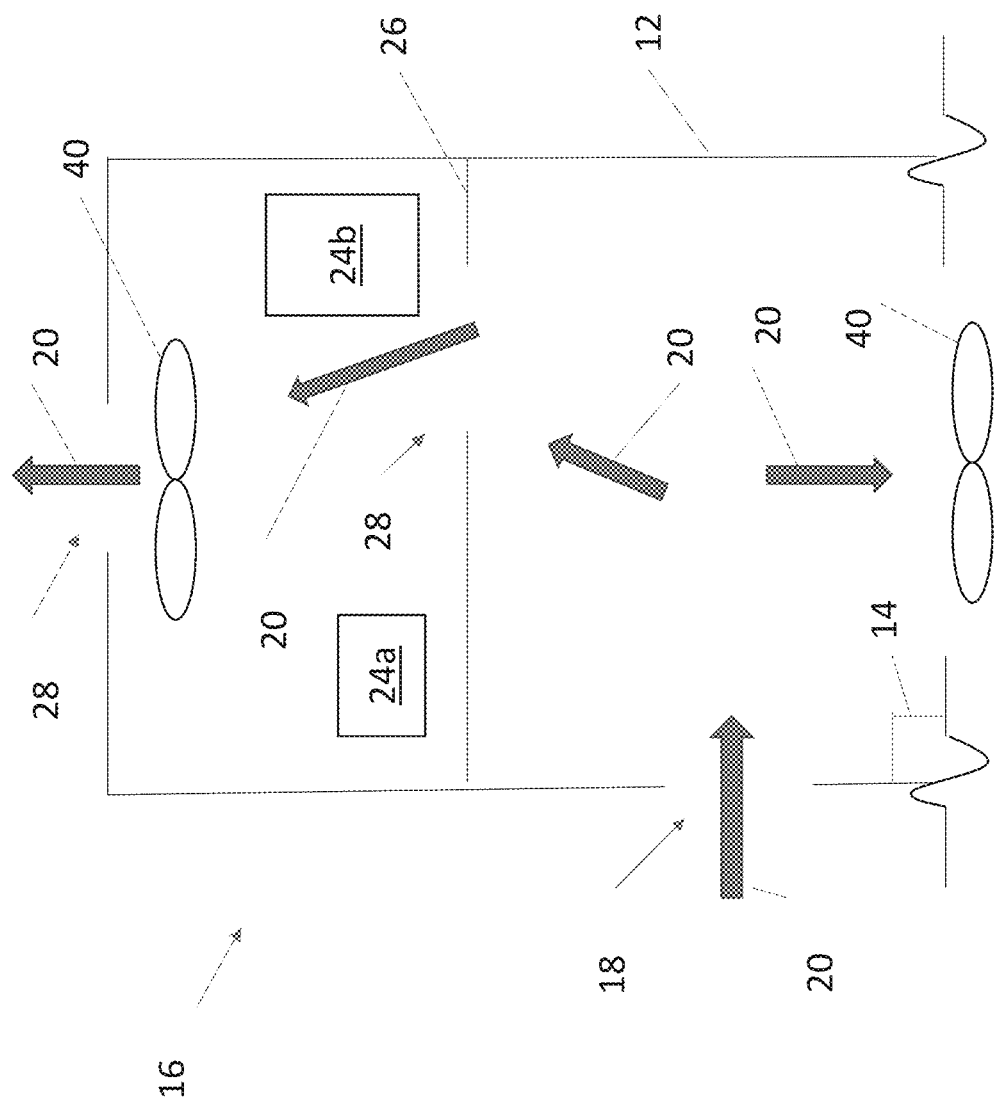
FIG. 4 is a side sectional view of the display assembly of FIG. 3 illustrating exemplary airflow.
Figure 5:
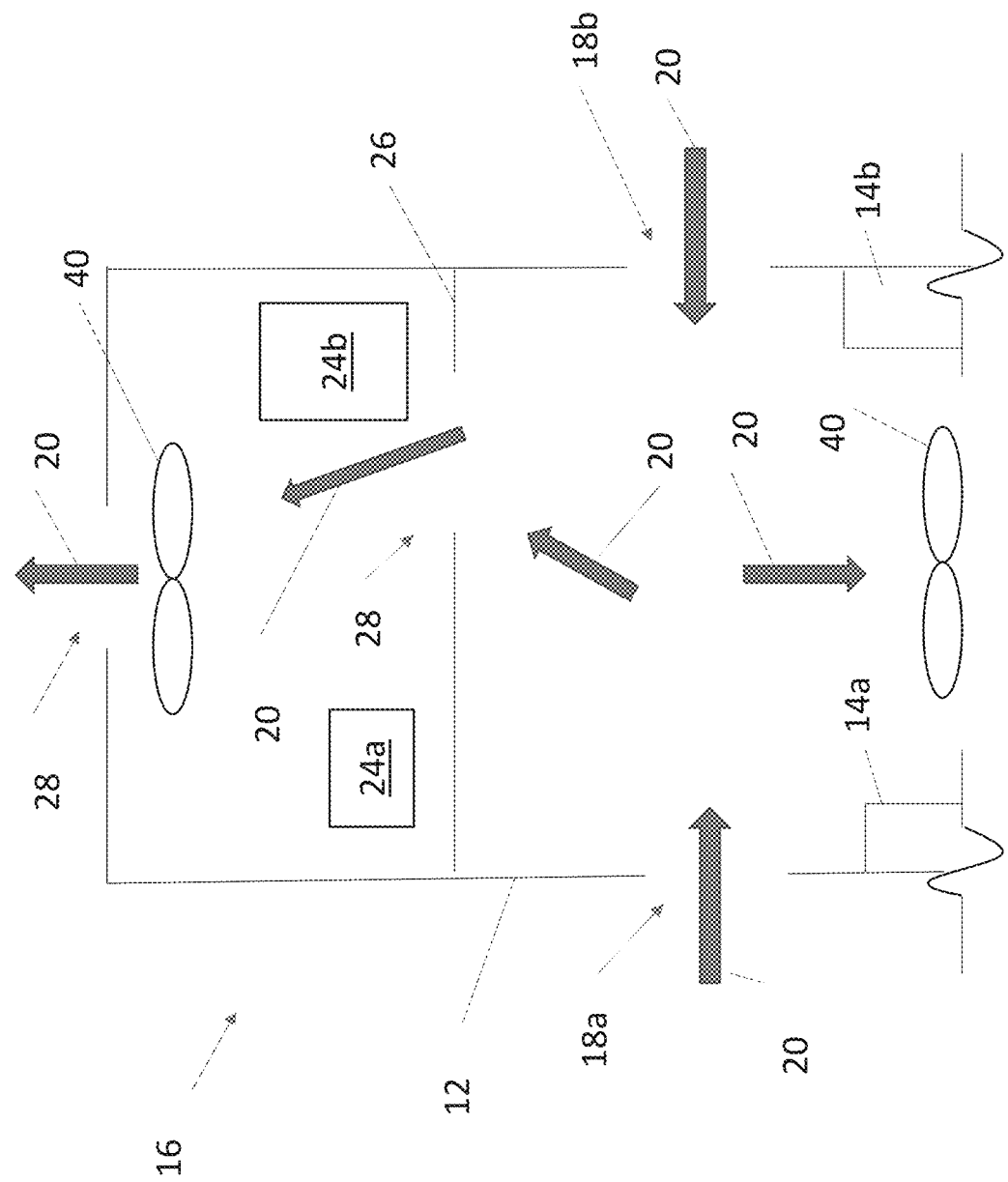
FIG. 5 is a side sectional view of the display assembly of FIG. 3 illustrating other exemplary airflow.

FIG. 3 illustrates another exemplary display assembly 10. FIG. 4 illustrates an exemplary airflow configuration for a display assembly 10 having a single electronic display subassembly 14. FIG. 5 illustrates an exemplary airflow configuration for a display assembly 10 having multiple electronic display subassemblies 14. Any number of electronic display subassemblies 14 with any size or shape housing 12 may be utilized.

One or more fans 40 may be provided within the communications box 16 to force the flow of ambient air 20 through the convection aperture plate 26 and the communications box 16 when activated. While illustrated as being proximate to the vent 28, one or more such fans 40 may alternatively or additionally be located proximate to the intakes 18 or elsewhere within or adjacent to the communications box 16. The fan(s) 40 may be of the same or different type and may comprise, for example, without limitation, axial fans, centrifugal fans, or the like. The fans 40 may comprise axial fans, centrifugal fans, combinations thereof, or the like.

Other fans 40 may be provided at various locations within the assembly 10, such as to force ambient air 20 along or through the electronic display assemblies 14, the housing 12, or other locations within the assembly 10. The display assemblies 10 may utilize one or more open loop airflow pathways, one or more closed loop airflow pathways, combinations thereof, or the like.

In exemplary embodiments, at least one of the electronic components 24 may comprise a sensor, and readings from the sensor may be used to adjust operations of the fan(s) 40. For example, without limitation, the electronic components 24 may comprise a temperature sensor, and fan 40 speed may be increased and/or additional fans 40 may be activated as temperatures rise (e.g., during daytime hours and/or during warmer days) and fan 40 speed may be decreased and/or fans 40 may be deactivated as temperatures fall (e.g., during nighttime hours and/or cooler days).

Figure 6:
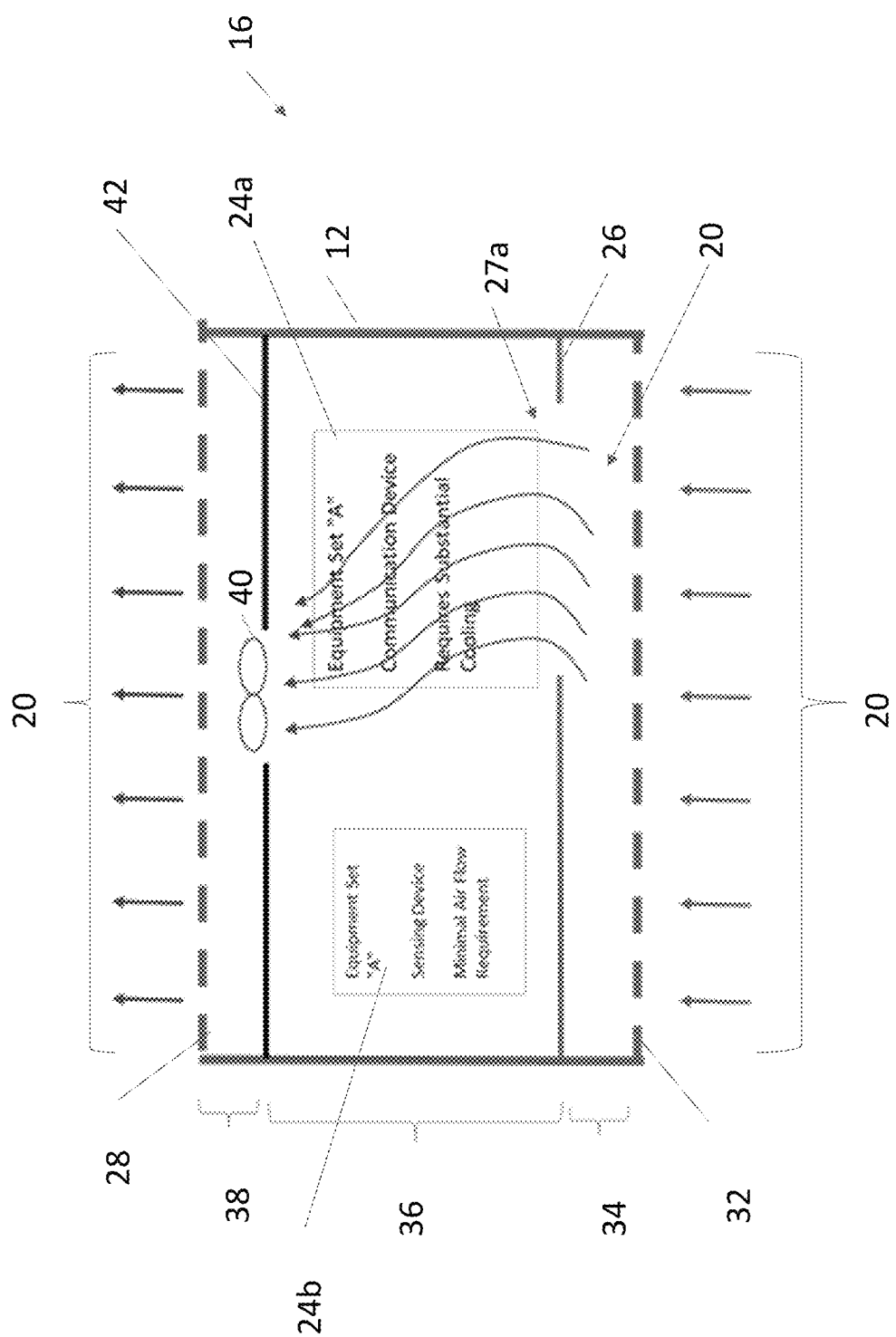
FIG. 6 is a detailed sectional view of an exemplary communications box with an exemplary convection aperture plate.

FIG. 6 illustrates another exemplary communications box 16. In the illustrated embodiment, which is provided, for example, but without limitation, ambient air 20 may be ingested into the communications box 16 by way of an intake portion 32. The ingested ambient air 20 may be directed through at least one aperture 27a proximate a first set of electronic equipment 24a. For example, without limitation, the first set of electronic equipment 24a may comprise communication devices which require substantial cooling. The airflow 20 may be directed away from a second set of electronic equipment 24b due to a lack of apertures 27 in the convection aperture plate 26 proximate to the second set of electronic equipment 24b. For example, without limitation, the second set of electronic equipment 24b may comprise sensing devices which require minimal to no airflow.

The communications box 16 may comprise an intake portion 32. The communications box 16 may comprise a vent 28. The intake portion 32 may extend along some or all of a lower surface of the communications box 16, though other locations may be utilized. The intake portion 32 may be configured to receive some or all of the ambient air 20 ingested through the intakes 18. The vent 28 may extend along some or all of an upper surface of the communications box 16, though other locations may be utilized. The vent 28 may be configured to exhaust some or all of the ambient air received within the communications box 16. An air inlet plenum 34 may be formed between the intake portion 32 and the convection aperture plate 26. An equipment cavity 36 may be formed between the convection aperture plate 26 and a mounting surface 42 for the fan(s) 40. The electronic equipment 24 may be secured within the equipment cavity 36. An air outlet plenum 38 may be provided between the mounting surface 42 and the vent 28. In other exemplary embodiments, the intake portion 32 and/or the mounting surface 40 are not required or are of varying size and shape.

Figure 7:
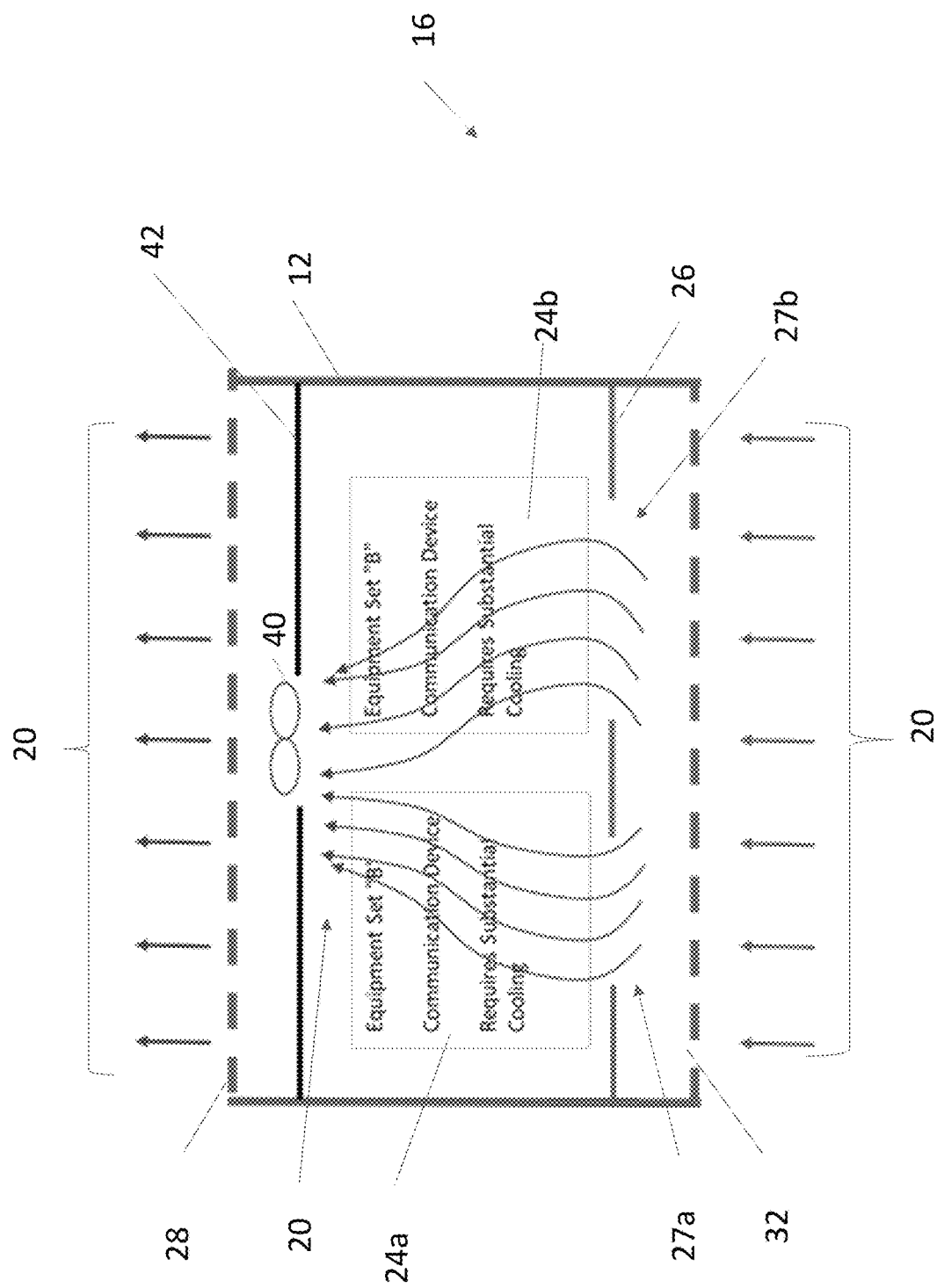
FIG. 7 is a detailed sectional view of the communications box of FIG. 6 with another exemplary convection aperture plate.

FIG. 7 illustrates the communications box 16 with another exemplary convection aperture plate 26. The convection aperture plate 26 may comprise at least a first aperture 27a proximate one or more first items of equipment 24a and a second aperture 27b proximate to one or more second items of equipment 24b. In this way, a portion of the ambient air 20 entering the communications box 16 may be directed to the first set of equipment 24a and a second portion of the ambient air 20 may be directed to the second set of equipment 24b. For example, without limitation, both the first and second sets of equipment 24a, 24b may require cooling for operation.

Figure 8:
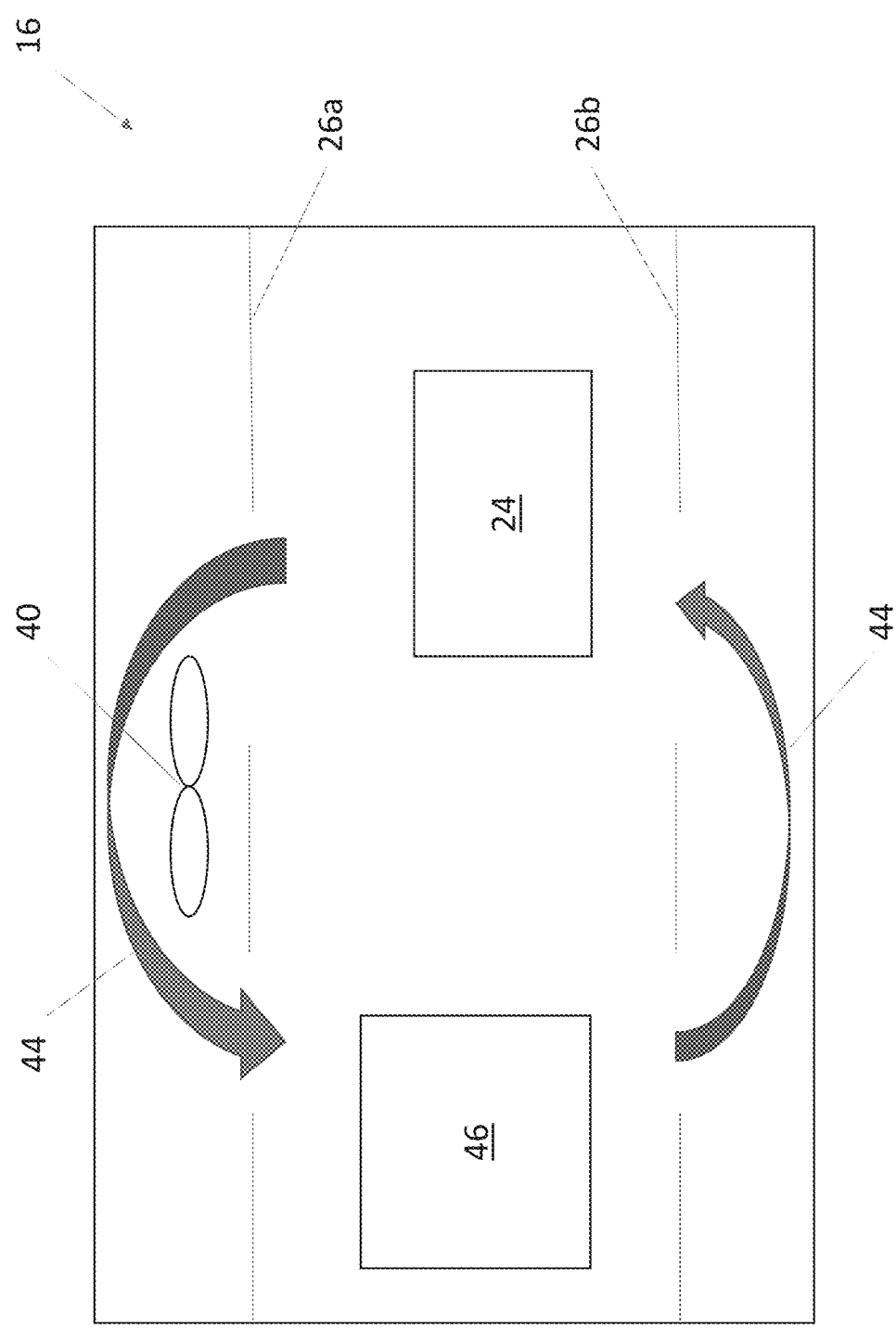
FIG. 8 is a detailed sectional view of another exemplary communications box with other exemplary airflow.

FIG. 8 illustrates another exemplary embodiment of the communications box 16. The communications box 16 may be wholly or partially sealed such that circulating gas 44 flows within the communications box 16. One or more convection aperture plates 26a, 26b may be located with the communications box 16. One or more thermal management devices 46 may be located within, or be in fluid communication with, the communications box 16. The thermal management devices 46 may include, for example, without limitation, heat exchangers, thermoelectric cooling devices, heat sinks, some combination thereof, or the like. One or more fans 40 may be provided to circulate the circulating gas 44 within the communications box 16. Heat may be removed from, or imparted to, the circulating gas 44 by the thermal management devices 46.

Figure 9:
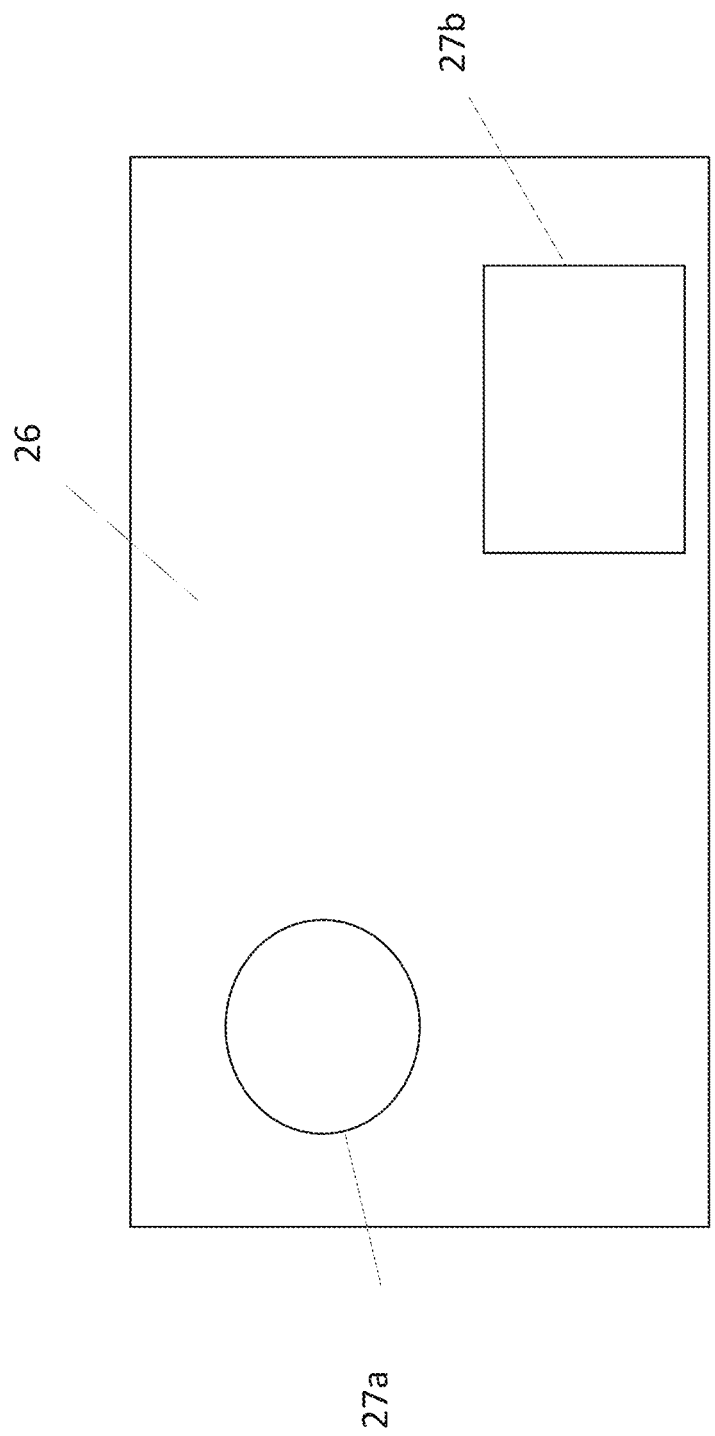
FIG. 9 is a top view of another exemplary convection aperture plate.
Figure 10:
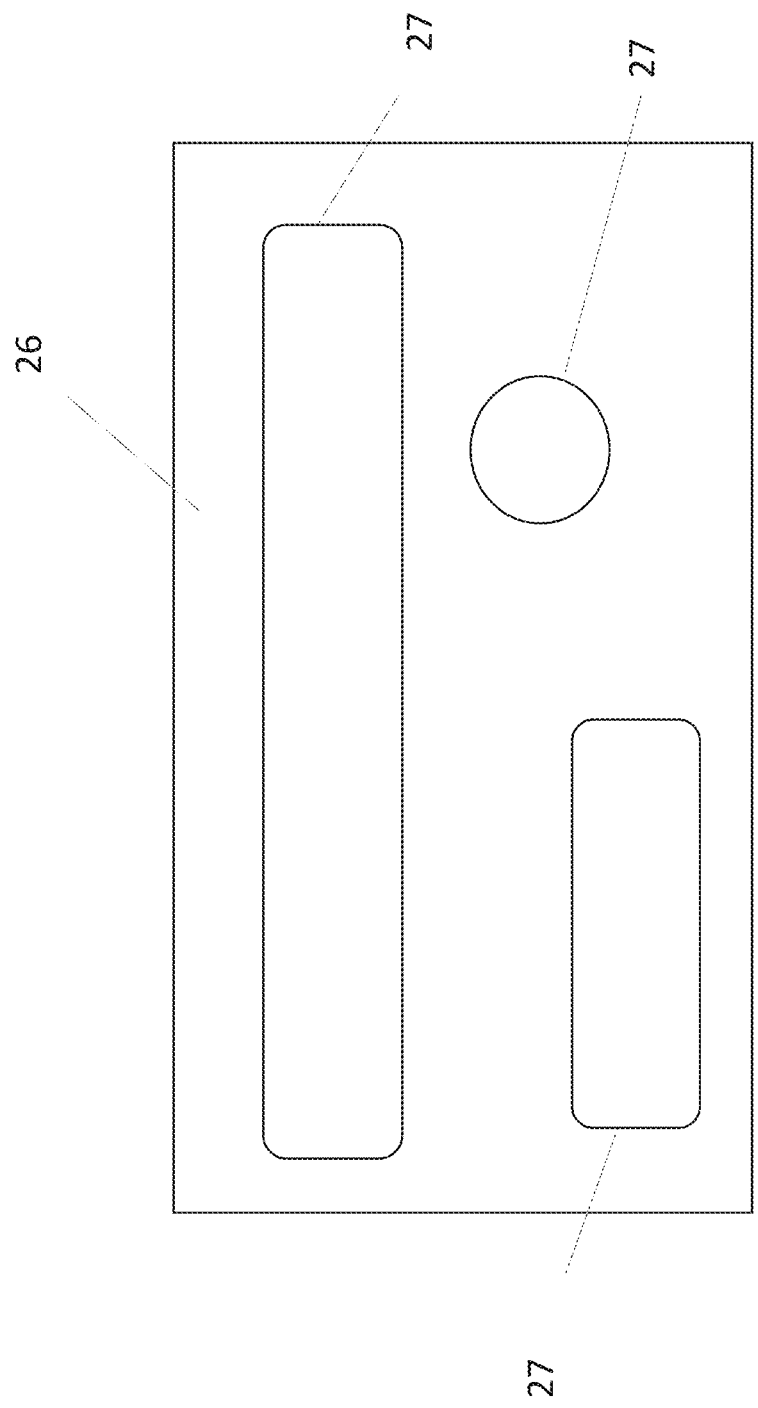
FIG. 10 is a top view of another exemplary convection aperture plate.

FIG. 9 and FIG. 10 illustrate exemplary convection aperture plates 26. One or more apertures 27 may be provided about the convection aperture plate 26. The apertures 27 may be of the same or different size and shape. Any number of apertures 27 may be provided in any arrangement. The apertures 27 may be placed proximate to certain electronic components 24 of the communications box 16, though such is not required.

Those of skill in the art will appreciate that the convection aperture plate 26 may be utilized, alternatively or additionally, at locations within the assembly 10 other than the communications box 16. For example, without limitation, the convection aperture plate 26 may be utilized between electronic display subassemblies 14, below the electronic display subassemblies 14, combinations thereof, or the like.

Multiple convection aperture plates 26 may be used within the communications box 16 and/or the display assembly 10. Such convection aperture plates 26 may be of the same or different type. For example, without limitation, a convection aperture plate 26 may be used in place of one or more of the mounting surface 42, the vent 28, and/or the intake portion 32. As another example, without limitation, a first convection aperture plate 26 may be used in the communications box 16 and a second convection aperture plate 26 may be utilized between the electronic display subassemblies 14.

Figure 11:
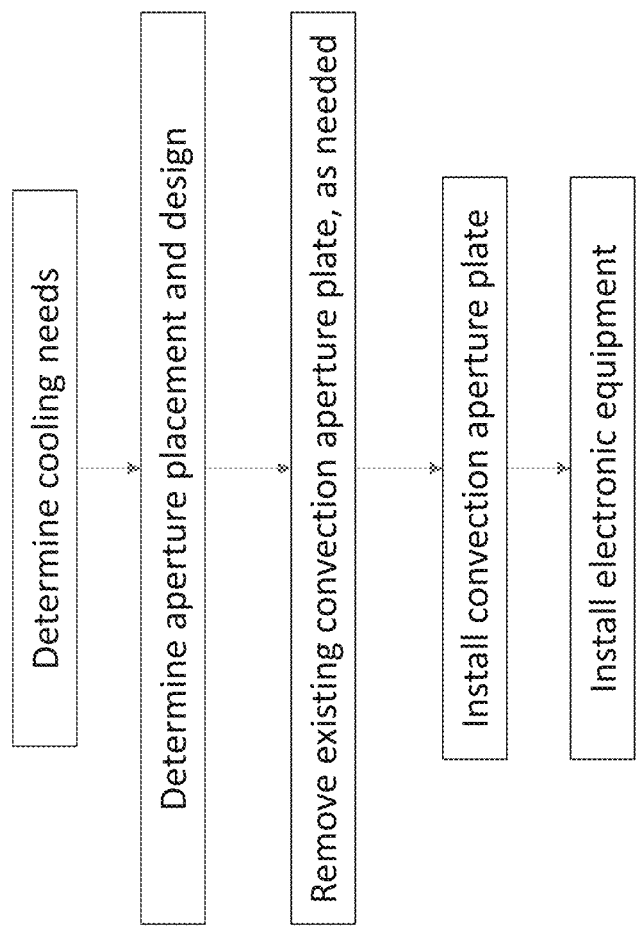
FIG. 11 is a flow chart with exemplary logic for installing the convection aperture plates.
Figure 12A:
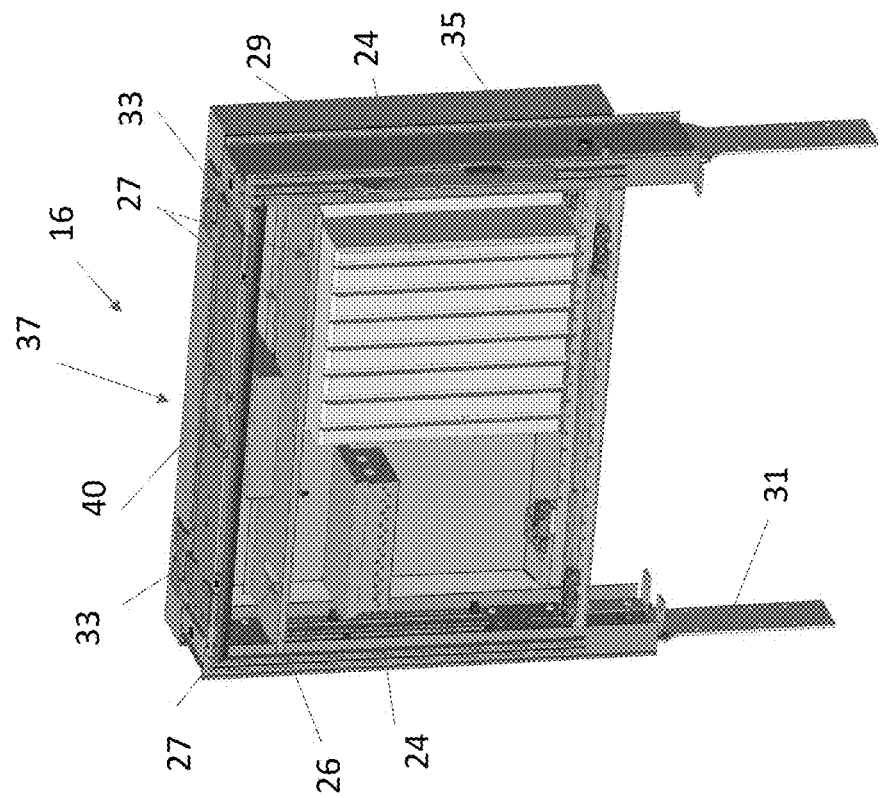
FIG. 12A is a sectional perspective view of another exemplary communications box with another exemplary convection aperture plate for exemplary electronic components.
Figure 12B:
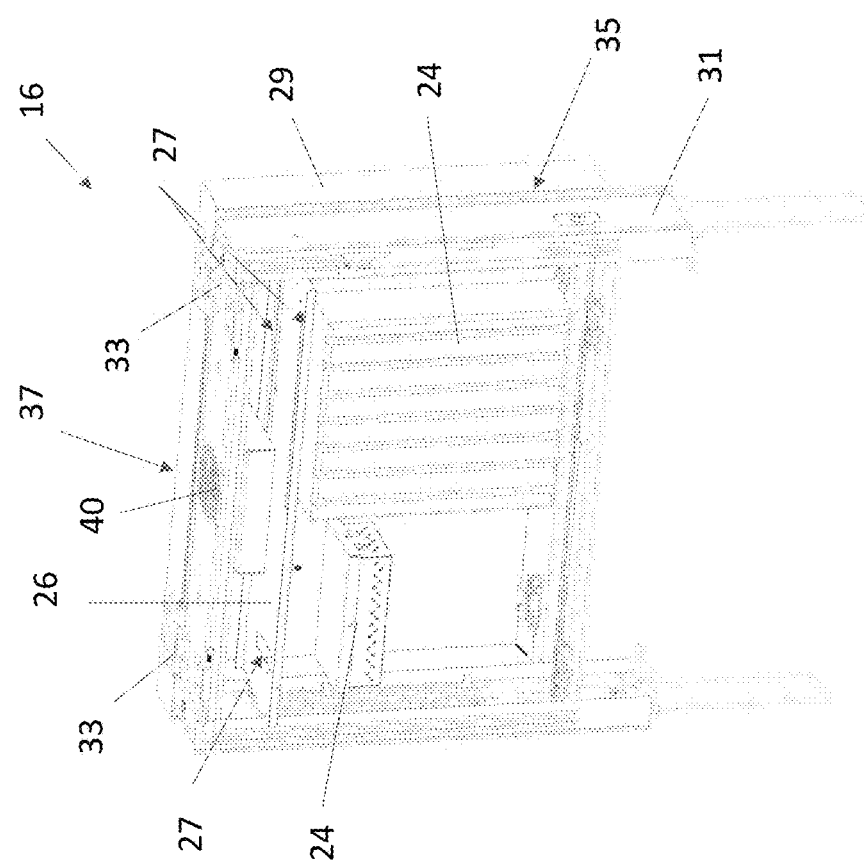
FIG. 12B is a line drawing version of FIG. 12A.
Figure 13A:
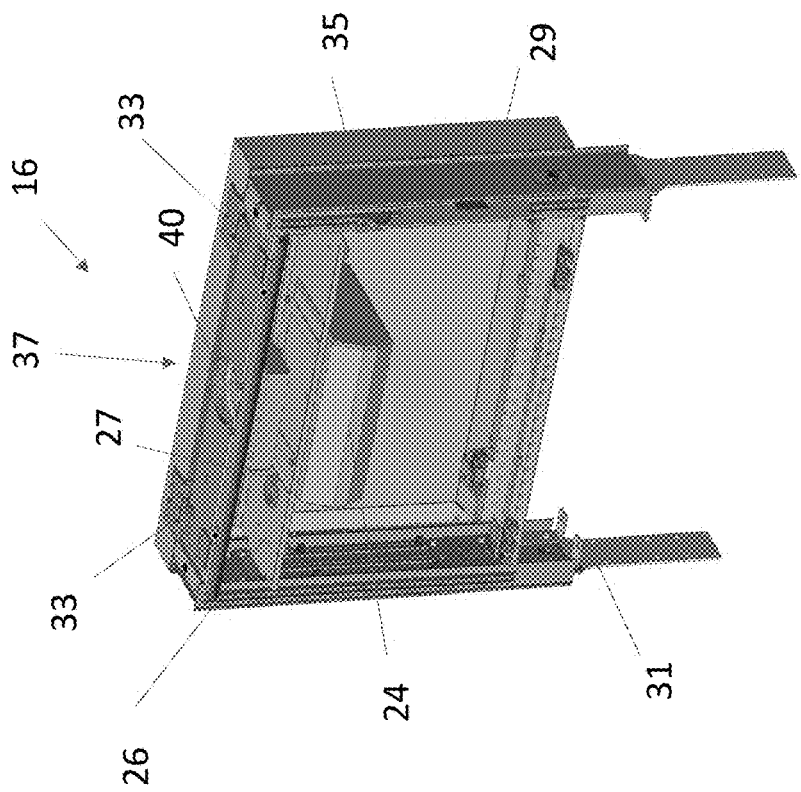
FIG. 13A is a sectional perspective view of another exemplary communications box with another exemplary convection aperture plate for other exemplary electronic components.
Figure 13B:
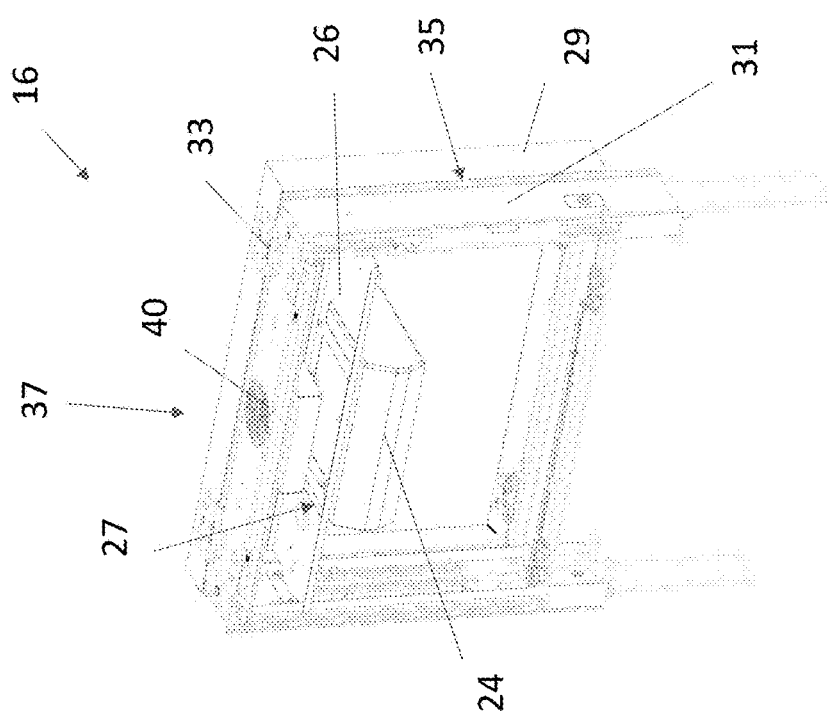
FIG. 13B is a line drawing version of FIG. 13A.
Figure 14A:
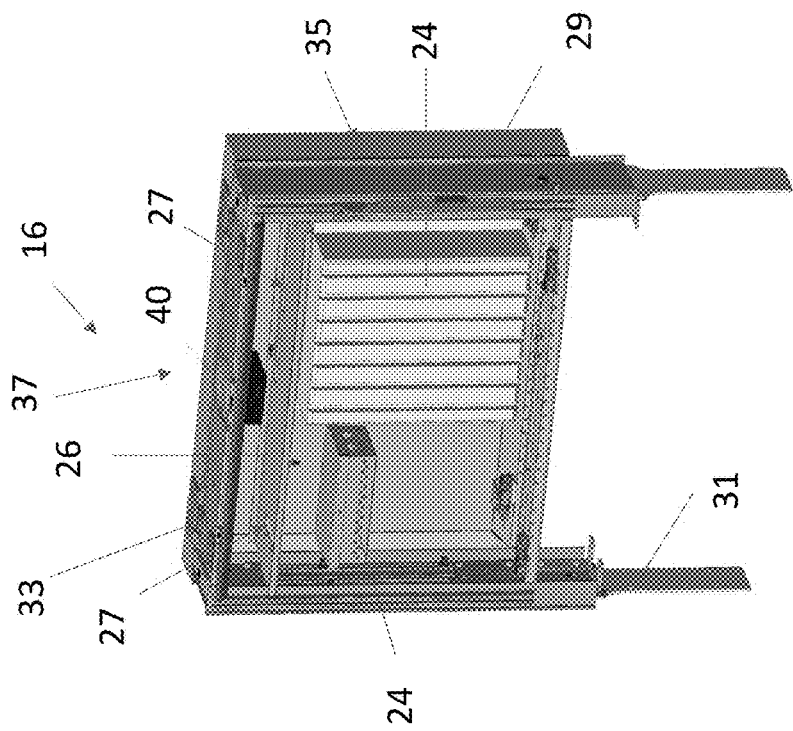
FIG. 14A a sectional perspective view of another exemplary communications box with another exemplary convection aperture plate for other exemplary electronic components.
Figure 14B:
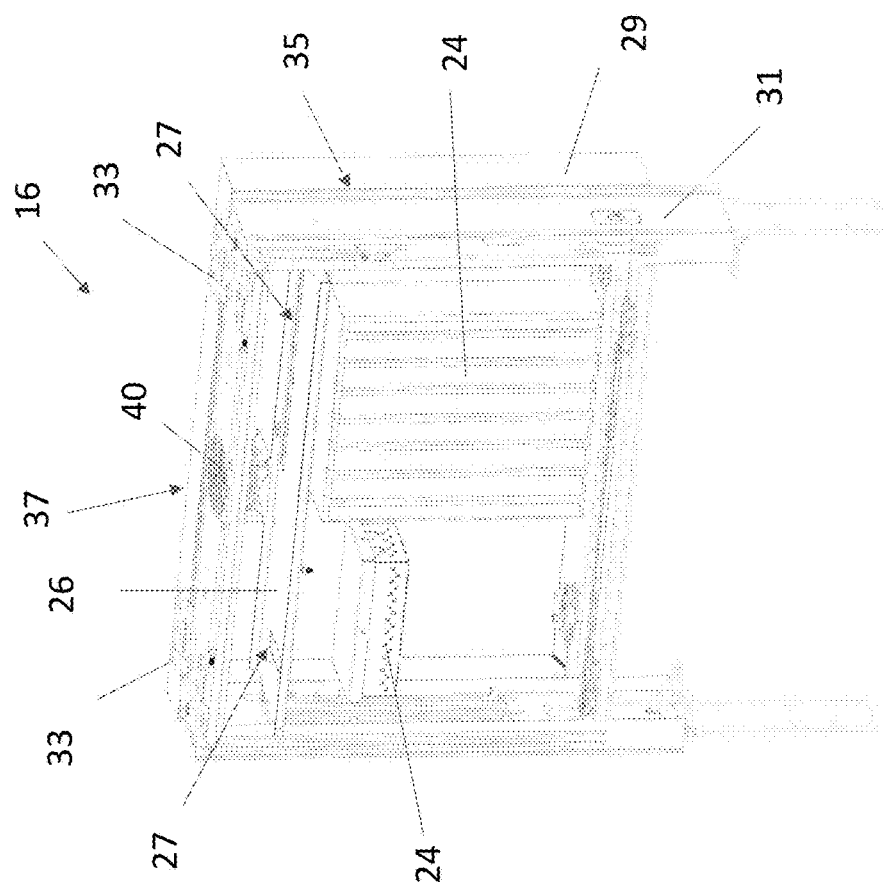
FIG. 14B is a line drawing version of FIG. 14A.

FIG. 11 illustrates steps for fitting a communications box 16 with a convection aperture plate 26. The communication box 16 may be retrofitted with one or more convection aperture plates 26. Such retrofitting may be performed to improve airflow for existing electronic components 24 and/or to optimize airflow for new electronic components 24 previously installed, concurrently installed, or to be installed in the future. Alternatively, or additionally, existing convection aperture plates 26 may be removed from communications boxes 16 and replaced with convection aperture plates 26, which may be configured to optimize airflow for new electronic equipment 24 previously installed at, concurrently installed at, or to be installed at, the communications box 16. Design and placement of apertures 27 in the convection aperture plates 26 may be accomplished using various manual or computerized flow analysis techniques.

The convection aperture plates 26 may be integrally formed with, welded, soldered, brazed, bonded, adhered, some combination thereof, or the like to the communications box 16. The convection aperture plates 26 may be cut out and replaced as needed. In other exemplary embodiments, the convection aperture plates 26 may be configured for faster removal, such as by way of fasteners, snap fittings, pressure fittings, friction fit, combinations thereof, or the like.

FIG. 12A through FIG. 14B illustrate other exemplary communications boxes 16. Each communications box 16 may, in exemplary embodiments, comprise one or more access panels 29. Each of the access panels 29 may be connected to a frame 31 in a moveable manner, such as, but not limited to, by way of one or more hinging devices 33. A gap 35 may be provided along some or all of a perimeter of the access panel 29 between the access panel 29 and the frame 31. For example, without limitation, the gap 35 may be located between a bottom portion of the access panel 29 and the adjacent portion of the frame 31. The gap 35 may serve as a vent 28 for exhausting ambient air. Where more than one access panel 29 is provided, more than one gap 35 may be provided. In exemplary embodiments, a first and second access panel 29 is provided on opposing sides of said frame 31.

The frame 31 may be connected to housing 12. Alternatively, or additionally, the frame 31 may form at least a portion of the housing 12. The frame 31 and/or the housing 12 may comprise multiple components. One or more openings 37 may be provided at the communications box 16 for ingesting and/or exhausting ambient air to or from the communications box 16. The openings 37 may be positioned adjacent to each of the fans 40.

The fans 40 may be configured to pull air through the gap 35 and through the apertures 27 in the convection aperture plate 26 before being exhausted from the communications box 16, such as by way of the openings 37. In other exemplary embodiments, the fans 40 may be configured to ingest air, such as by way of the openings 37, which is pushed through the apertures 27 in the convection aperture plate 26 before being exhausted from the communications box 16 by way of the gap 35. In such embodiments, the airflow for the communications box 16 may be fluidly separated from the airflow for the electronic display subassemblies 14.

In exemplary embodiments, the fans 40 and/or the electronic components 24 may be mounted to the convection aperture plate 26. In such embodiments, a separate mounting surface 42 may not be required. Alternatively, or additionally, the fans 40 may be mounted to a portion of the frame 31 and/or the access panels 29. The electronic components 24 may, alternatively or additionally, be mounted to the access panels 29.

One or more convection aperture plates 26 may be provided at various locations within the communications box 16 and/or elsewhere within the display assembly 10. For example, without limitation, the convection aperture plate 26 may be located upstream and/or downstream of electronic equipment 24 within the communications box 16. The location of the convection aperture plate 26 may be changed when new such electronic equipment 24 is installed or relocated within the communications box 16 or elsewhere within the display assembly 10.

Apertures 27 may be provided at the convection aperture plate 26 adjacent to certain electronic components 24, but not others. Solid material and/or different size, shape, and/or type of apertures 27 may be provided at the convection aperture plate 26 adjacent to other certain electronic components 24. The convection aperture plate 26 may be placed upstream, downstream, or otherwise of the electronic components 24 relative to the openings 37.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A field customizable airflow system comprising:
   an electronic display subassembly;
   a housing for said electronic display subassembly, said housing comprising an intake for ingesting ambient air and an exhaust for exhausting ambient air; and
   a communications box located above said electronic display subassembly and comprising:
   a frame;
   an access panel moveably connected to said frame;
   one or more electronic components;
   a convection aperture plate comprising one or more apertures;
   an intake portion for accepting ambient air that is spaced apart from said intake;
   an exhaust portion for exhausting ambient air comprising a gap between an access panel and a frame for the communications box; and
   one or more fans configured to, when activated, cause a flow of ambient air to be accepted at said intake portion, forced through each of said one or more apertures in said convection aperture plate, and exhausted through said exhaust portion.

2. The field customizable airflow system of claim 1 wherein:
   a first one of said one or more apertures is located adjacent to a first one of said one or more electronic components.

3. The field customizable airflow system of claim 2 wherein:
   said first one of said one or more electronic components comprises communications equipment.

4. The field customizable airflow system of claim 3 wherein:
   a second one of said one or more electronic components comprises a sensor; and
   said convection aperture plate comprises an uninterrupted solid surface adjacent to said second one of said one or more electronic components.

5. The field customizable airflow system of claim 2 wherein:
   said first one of said one or more apertures comprises a first size and shape; and
   a second one of said one or more apertures is located adjacent to a second one of said one or more electronic components and comprises a second size and shape.

6. The field customizable airflow system of claim 1 wherein:
   said intake portion is in fluid communication with said intake.

7. The field customizable airflow system of claim 1 wherein:
   said intake portion comprises an aperture in an upper surface of said frame.

8. The field customizable airflow system of claim 1 further comprising:
   a second electronic display subassembly positioned back-to-back with said electronic display subassembly.

9. The field customizable airflow system of claim 1 wherein:
   said electronic display subassembly comprises:
   an electronic display layer comprising liquid crystals; and
   a backlight comprising a number of light emitting diodes mounted to a substrate behind said electronic display layer.

10. The field customizable airflow system of claim 1 wherein:
    said fan comprises a centrifugal fan.

11. The field customizable airflow system of claim 1 wherein:
    said convection aperture plate is configured to create a barrier within said communications box such that airflow is forced to travel through said one or more apertures.

12. The field customizable airflow system of claim 11 wherein:
    an interior of said communications box defines a first footprint; and
    said convection aperture plate defines a second footprint matching the first footprint.

13. The field customizable airflow system of claim 1 wherein:
    a first one of said one or more apertures defines a first shape; and
    a second one of said one or more apertures defines a second shape which is different from said first shape.

14. The field customizable airflow system of claim 1 wherein:
    said communications box defines a cuboid shape.

15. A field customizable airflow system comprising:
    a frame;
    one or more electronic display subassemblies mounted to said frame, each comprising an airflow pathway for ambient air; and
    a communications box attached to said frame at a location above each of said one or more electronic display subassemblies, said communications box comprising:
    an access panel moveably mounted to said frame;
    a first electronic component having a first airflow requirement;
    a second electronic component different from said first electronic component and having a second airflow requirement;
    a convection aperture plate configured to create a barrier within said communications box and comprising an aperture located adjacent to said first electronic component and a solid surface adjacent to said second electronic component;
    an intake portion;
    a gap located between at least a portion of a perimeter of said access panel and said frame; and
    one or more fans configured to force, when activated, a flow of said ambient air through said ingestion portion, said aperture in said convection aperture plate, and said gap.

* * * * *